United States Patent [19]

Bowden et al.

[11] 4,289,845

[45] Sep. 15, 1981

[54] FABRICATION BASED ON RADIATION SENSITIVE RESISTS AND RELATED PRODUCTS

[75] Inventors: Murrae J. S. Bowden, Summit; Larry F. Thompson, Gillette, both of N.J.

[73] Assignee: Bell Telephone Laboratories, Inc., Murray Hill, N.J.

[21] Appl. No.: 907,873

[22] Filed: May 22, 1978

[51] Int. Cl.$^3$ .................................................. G03C 5/00
[52] U.S. Cl. ............................. 430/296; 156/643; 156/901; 427/43.1; 430/270; 430/317; 430/318; 430/319; 430/321; 430/323; 430/324; 430/325; 430/326; 430/327; 430/328; 430/330; 430/942
[58] Field of Search ............... 96/27 R, 35.1, 36, 36.2, 96/115 R, 115 P, 38.3; 427/43.1; 156/643, 901; 525/505; 430/296, 270, 317, 318, 319, 321, 323, 324, 325, 326, 327, 328, 330, 942

[56] References Cited

U.S. PATENT DOCUMENTS

| | | | |
|---|---|---|---|
| 3,157,501 | 11/1964 | Burrows et al. | 96/36 X |
| 3,201,255 | 8/1965 | Mueller et al. | 96/36 X |
| 3,255,006 | 6/1966 | Bailey | 96/36 |
| 3,657,177 | 4/1972 | Adesko | 525/505 X |
| 3,852,771 | 12/1974 | Ross et al. | 96/35.1 X |
| 3,916,036 | 10/1975 | Gipstein et al. | 427/43 |
| 3,936,557 | 3/1976 | Watt | 427/43 X |
| 3,950,173 | 4/1976 | Ross et al. | 427/43 X |
| 3,996,393 | 12/1976 | Cortellino et al. | 427/43 |
| 4,011,351 | 3/1977 | Gipstein et al. | 427/43 |
| 4,045,318 | 8/1977 | Nimics et al. | 96/35.1 X |
| 4,065,306 | 12/1977 | Ross et al. | 96/36 X |
| 4,097,618 | 6/1978 | Poliniak | 427/41 |
| 4,103,064 | 7/1978 | McAlear et al. | 427/43 X |
| 4,153,741 | 5/1979 | Poliniak et al. | 96/115 R X |

OTHER PUBLICATIONS

DeForest, "Photoresist", 6/75, pp. 55–57.
Thompson et al., "A New Family of Positive Electron Beam Resists-Poly(Olefin Sulfones)", 12/73, pp. 1722–1726.
DeForest, *Photoresist*, 6/75, pp. 164–168.

*Primary Examiner*—Edward C. Kimlin
*Attorney, Agent, or Firm*—George S. Indig

[57] ABSTRACT

A phase compatibile polymer blend serves as a radiation sensitive lithographic resist in the fabrication of circuits and circuit elements. Radiation sensitivity is due to inclusion of a "modifier". Resist properties, notably stability to agents and ambients to be masked are attributed largely to a second component, the "matrix polymer".

In an exemplary embodiment in which the blend is positive acting, fabrication including dry processing is dependent upon use of a resist blend of a vapor developing polysulfone and a novolac. The novolac, inherently soluble in alkaline media is rendered insoluble in the blend. Radiation initiated depolymerization results in volatilization of the modifier to render the irradiated portions of the resist soluble in alkaline developers.

Modifier may function in other manner; for example, it may undergo radiation initiated polymerization so as to insolubilize the blend in irradiated regions, so resulting in a negative acting resist.

Effective isolation of lithographic from masking functions permits design of blends with high lithographic sensitivity, as well as good processing stability. The latter is sufficient to permit use in many dry processing procedures as practiced in direct writing, as well as in mask fabrication of large scale integrated silicon circuits.

29 Claims, No Drawings

FABRICATION BASED ON RADIATION SENSITIVE RESISTS AND RELATED PRODUCTS

BACKGROUND OF THE INVENTION

A. Technical Field

Small circuits or circuit elements of feature size of the order of a few micrometers or smaller generally undergo one or more lithographic delineation steps in fabrication. One such category of circuits often fabricated in and on epitaxial silicon is known as large scale integration (LSI). Prevalent manufacture is based on sets of discrete masks patterned by means of ultraviolet light, electron beam or other actinic radiation. An alternative approach, known as "direct processing", is based on primary pattern delineation in masking layers affixed directly to the device or circuit during manufacture.

All such processes involve primary or secondary pattern delineation to eventually permit plating, etching or other modification of underlying active material exclusively in bared regions of apertured masking layers.

B. History

Historically, printed circuits and then integrated circuits were patterned by draftsmen. A sophisticated product based on the primary design eventually evolved. This product, a "mask" containing many precisely placed identical patterns, was produced by photographically reducing, stepping and repeating the design. Patterns so produced in radiation sensitive "resist" layers were often replicated in underlying metal to result in "hard" masks. Manufacture of typical silicon integrated circuits (SIC) may involve use of a set of ten or more such masks, members of which are necessarily precisely delineated and positioned so as to permit registration.

As the trend toward miniaturization continued; as device density increased; as minimum feature size decreased to micrometer dimensions, alternative approaches to primary pattern delineation were adopted. A procedure now gaining impetus involves delineation on a 1:1 scale by means of a programmed electron beam. Regardless of how such masks are produced, masters or copies are used in the replication of patterns in resist layers formed as adherent coatings on the circuit material being processed. In SIC's, such a resist layer is formed in each lithographic step of the processing sequence. Replicated relief patterns serve to mask the circuit material during procedures such as etching, plating, ion implantation, and the like.

At this time, long wavelength ultraviolet (near u.v.) is the prevalent actinic radiation used for replicating patterns. In recognition of the fact that significant further miniaturization may be impeded by diffraction, by standing waves, and even by wavelength dimensions, some considerable effort is being expended on resists and procedures which depend upon other forms of radiation—e.g., short wavelength ultraviolet (far u.v.), X-ray, as well as accelerated charged particles—notably electrons.

There is a consensus of opinion that mask technology will, itself, eventually become a limitation on device miniaturization. Use of maskless technologies, which may be forestalled to some extent by use of shorter wavelength replication actinic radiation, is generally expected to become significant for design rules in the micrometer or submicrometer range. Progression from large scale integration (LSI), to the next level of integration—sometimes called very large scale integration (VLSI)—is expected to mark a transition to "direct processing."

Direct processing contemplates primary pattern delineation in a resist layer on the circuit material, itself. So, rather than delineate a pattern in a resist layer to produce a discrete mask, the pattern is delineated directly in a resist layer on the device being fabricated. Demands placed on resist material are sometimes implicit—appropriate adherence, stability, sensitivity to desired radiation, resolution, contrast, etc. All such requirements become more stringent for increasing miniaturization. So, for example, adherence must be more nearly perfect, defect count must be reduced, etc. Other requirements now imposed on the direct processing resist are transferred from those originally demanded of the replicating resist. In addition to the enumerated and other lithographic requirements, direct processing resists and fabrication procedures designed to accommodate them must be such as to result in minimal deterioration of patterns during a wide variety of processing steps. Particularly harsh are the "dry" processing steps considered preferable to "wet" processing for very fine scale. Dry processing—e.g., plasma etching, sputter etching, ion milling, reactive ion etching—may have a pronounced deteriorative effect on patterned resist materials.

A family of positive photoresists based on novolac is in widespread use in device and circuit fabrication. Conventional practice in the fabrication of silicon LSI's includes many procedural steps in which tightly adherent masking layers of novolac protect underlying regions from a variety of environments and reagents. Patterned masking layers of these phenolaldehyde products are produced photolithographically. Novolac-containing blends, insoluble in appropriate developer, is exposed to patterning radiation generally by replication from a master mask to effect increased solubility of irradiated portions. The mechanism depends upon a blend of a novolac and quinone diazide. The diazide decomposes to yield a product which reacts with atmospheric moisture to form a carboxylic acid. The diazide, which before radiation protected the novolac from dissolution in alkaline media, is no longer protected and radiation-induced solubility is achieved.

Radiation induced reaction requires one absorbed photon per event so that sensitivity of the photoresist is low—of the $1 \times 10^{-4}$ coulombs/cm$^2$. This is not a significant impediment in replication photolithography using flood radiation of near ultraviolet light.

The elegance of the novolac photoresist explains its long-standing, universal use. Radiation sensitivity is due to an admixed component, while processing stability of the processed material is primarily due to the novolac, itself. The functions of photolithographic patterning and device processing are, in reality, met by chemically distinct species.

Unfortunately, low radiation-sensitivity due to the inherent nature of the novolac system results in low throughput for primary pattern delineation.

C. SUMMARY OF THE INVENTION

1. Problem

Fabrication of fine detail (micrometers or less) devices or circuits by procedures involving lithography results in imposition of a number of requirements. Regardless of fabrication technique; regardless of the type of actinic radiation utilized, requirements imposed on resist materials include sufficient resolution, contrast, shelf life, etc. Since brightness available from radiation sources is finite, sensitivity of the radiation sensitive material (the resist) may be significant. This is important in fine feature primary pattern delineation, where small beam diameter inherently increases writing time for given brightness.

Where the resist is used as a replication resist on the device material, or where the device material is processed directly by a maskless technique, the requirement of compatibility of resists and processes may be limiting. For small feature size, "dry processing"—processing involving use of ion beams, plasmas and the like—translates into extremely demanding requirements for radiation stability of the patterned resist.

Positive resists—material in which patterns result from removal of irradiated material—may be inherently unstable to device processing conditions (delineation generally involves some depolymerization by irradiation so as to increase solubility). It has been recognized that such materials are likely to depolymerize during dry processing.

The stability problem is not inherent in the same sense in negative resists. Nevertheless, negative resists satisfactory for dry processing are not commercially available.

The problem is, to a large extent, solved in conventional replication photoresist processes. Here, use may be made of novolac-type resists in which processing stability is effectively insulated from lithographic sensitivity.

The novolac approach is no solution, since the single event/photon results in a sensitivity generally inadequate from the standpoint of commercial primary pattern delineation. A particular problem exists in the instance of electron beam primary pattern delineation. It is not expected that improvement in electron source brightness will have a sufficient impact on throughput. Similar problems exist in some forms of secondary pattern delineation—e.g., short wave ultraviolet, electron flood, and X-ray.

2. Solution

Processes are dependent upon phase compatible blends containing at least two components. The first, denoted "modifier", is designed to modify development properties of the blend—in most instances, to modify development properties of the second component denoted "matrix polymer". Whatever the nature of the modification, irradiation alters its nature.

In a category of resists which are positive acting, a matrix polymer soluble in a particular developer is blended with a modifier which is relatively insoluble in such developer. The effect of the modifier is to render the blend insoluble in its totality. Irradiation during lithographic patterning initiates depolymerization of the modifier, resulting in removal, thereby returning the irradiated portions of the blend to a solubility essentially characteristic of the matrix polymer.

In another category of resists—negative acting resists—the matrix polymer, again soluble in a particular developer, is blended with a monomer which, itself, has little effect on solubility. Radiation initiated polymerization produces a relatively insoluble polymer of the modifier monomer, thereby decreasing solubility in the irradiated regions.

In the main, the inventive advance is design flexibility due to effective isolation of lithographic and masking characteristics. The fact that the matrix polymer need not be radiation sensitive permits freedom of choice with a view to stability to the ambients and other processing agents used in device fabrication.

Radiation sensitivity is due to self-propagation of the reaction initiated by irradiation. Accordingly, one category of modifiers depolymerizes with many chain scission events following initial photon induced chain scission. In a second category, polymerization proceeds without further energy absorption following first photon induced dimerization or polymerization. Where other reactions are demanded of the modifier, these, too, are self-propagating.

It is considered that the many event per photon activity of the modifier most clearly characterizes the advance realized by the invention.

From a commercial standpoint, permitted use of matrix polymers familiar to workers with knowledge of near ultraviolet photoresists is expected to result in ready acceptance.

DETAILED DESCRIPTION

I. Introduction

Description is facilitated by use of an exemplary category of process-resist couples. This category is, in some ways, analogous to the well-known novolac photoresist in two respects. (1) The matrix polymer may, in fact, be a novolac and constitutes the operative part of the resist material remaining in the pattern after development. (2) The modified polymer forms a phase compatible blend with a matrix polymer to substantially reduce its insolubility in a medium within which the unprotected matrix polymer is soluble. The inhibitor polymer is altered—in this instance, removed through vapor development—by patterning irradiation to return the matrix polymer to a state which is once again soluble.

In an embodiment of particular interest, the phase compatible blend is made up of a novolac polymer and poly(2-methylpentene-1 sulfone). The sulfone vapor develops at room temperature so that development in a suitable solvent results in a novolac pattern. In general, the novolac pattern is amenable to the various agents and ambients to which prior art photoresist novolac patterns are exposed.

The genus of positive resists suitable to the inventive processes extends beyond the positive acting exemplary novolac-sulfone resist. Removal of the inhibitor, while always many-event with respect to delineating radiation may be promoted by other means—e.g., general heating, during or subsequent to irradiation, various dry processing procedures, such as ion bombardment, chemical interaction, etc. The significant requirements of the inhibitor are (1) self-propagating chain scission; (2) alteration, (of inhibitor) generally by removal as a direct or indirect consequence of irradiation; (3) a degree of resistance during development to the alteration of inhibitor significantly greater than that of the matrix polymer, itself (in the exemplary novolac-sulfone, alteration is due to solubility in aqueous alkaline media); (4) ability to form a phase compatible blend with a matrix polymer so that the blend, itself, will evidence greater resistance to such alteration. By far the most significant family of inhibiting polymers are those which are depolymerizing and vapor developable.

It is significant that the matrix polymer may now be chosen without regard to radiation sensitivity. Choice of this component is largely in terms of masking properties. These properties, generally intrinsic, may, particularly in the instance of negative acting resists, be due to treatment subsequent to irradiation with reaction proceeding selectively dependent upon irradiation. The major requirements may be summarized: The matrix polymer should (1) yield a material with masking properties adequate for intended use (generally contemplated are the dry processes now gaining impetus in LSI fabrication) and (2) must form a phase compatible blend with the inhibitor polymer.

Resists and processes are suitable for e-beam pattern delineation. Primary and secondary patterning suitably employ a variety of delineation sources.

The invention is concerned with compatible processes and resists for lithographic pattern delineation. A preferred embodiment is concerned with "dry processing"—e.g., processing in which resist patterns serve to shield underlying, adherent surface regions during processing involving charged particles, such as, ions, ion radicals or electrons, or other reactive vapor species, such as free radicals. This is defined as a preferred embodiment for the reason that advantage is taken of two useful characteristics: (1) substantial throughput due to an expedient level of radiation sensitivity compatible with other resist characteristics and (2) resist stability to dry processing environments. While the invention is most meaningfully defined in terms of the resist composition-process pair, it is convenient to discuss it in terms of the two separately.

II. COMPOSITION

A. General

Resist compositions upon which all inventive resist-process couples and related articles are based include two essential ingredients: (a) modifier, and (b) matrix polymer. In each instance as discussed, the resistance in its entirety is a phase compatibility blend. It is an absolute requirement that prior to lithographic exposure the resist composition be homogeneous to the order of at least 500 Angstroms. A convenient determinative method for "phase compatibility" is transmitted light dark field optical microscopy (reference *Handbook of Chemical Microscopy* by Chamot and Mason published by Wiley and Sons, 1958). The requirement for phase compatibility as so stated is well understood to knowledgeable persons. Other determinaive techniques such as *Transmission Electron Microscopy* (TEM), differential thermal analysis, and dielectric and mechanical relaxation study, are examples. Under certain circumstances, for example, where essential components have the same or similar absorption for whatever form of radiation is utilized, a different determinant procedure is clearly indicated. It is also common to all aspects of the invention that masking properties of the patterned resist are due directly or indirectly to the matrix polymer. In the simplest case—that serving as a preferred embodiment—these properties are largely due to the matrix polymer itself. The function of the modifier is to somehow alter the matrix polymer so that behavior subsequent to exposure will discriminate between exposed and unexposed regions.

Relevant characteristics of the essential resist components are discussed:

B. Modifier

In many ways the modifier is the most significant component of the resist. It is characterized by a many-event response to absorption of but a single photon. For example, where lithographic processing depends upon depolymerization of the modifier, this depolymerization proceeds through a multitude of chain scission events as initiated by the first photo-induced chain scission event. Where lithographic function depends upon polymerization of the modifier it is again required that polymerizaton proceed through a finite number of steps without additional absorption of energy as initiated by the first photon absorption. It is this property which permits design of a resist of acceptable sensitivity to meet the needs of contemplated lithographic processing.

Regardless of whether the chain reaction is polymerization, depolymerization, or other, it may result directly from absorption of energy of actinic radiation or, in the alternative, it may be promoted by absorption of additional (non-patterning) energy. So for example, heating above ambient temperature during or subsequent to exposure may expedite either polymerization or depolymerization, or in fact any other change responsive for differentiation during development.

Much of the invention is discussed in terms of a positive acting resist. Exemplary blends for this purpose depend upon a polymeric modifier which depolymerizes—ideally vapor develops during lithographic irradiation. An illustrative material which vapor develops at room temperature is poly(2-methyl-2-pentene sulfone). It is found that inclusion of such modifier within the weight percentage range of from 5-50 percent based on the modifier-matrix polymer pair with a weight average molecular weight of from $10^4$ to $10^7$ if blendable with an appropriate matrix polymer, may result in a lithographic sensitivity based on incident does of 20 kv electrons of as little as $1 \times 10^{-6}$ Coulombs/cm$^2$.

Polysulfones constitute a promising category of modifiers. In addition to that specified above, other vapor developable polysulfones suitable for use are: poly(cyclohexane sulfone) and poly(2-heptene sulfone). In fact, all polysulfones investigated depolymerize under appropriate actinic irradiation. Listed materials vapor develop during exposure at room temperature; others may require additional energy during or subsequent to exposure. Stated more generally, any polymeric material raised above its polymerization temperature—suffices for depolymerization for this embodiment of the invention. It will be understood by any skilled polymer chemist that an additional implicit requirement is the essential absence of any competing mechanism such as cross-linking which may offset the desired effect of depolymerization.

The second identified embodiment involves self-propagating polymerization of the modifier as initialed by single photon absorption. Such modifier is ordinarily a monomer or a prepolymer with a polymerization mechanism taking the form of either chain polymerization or cross-linking. Since in a sense, the modifier is only compatible of performing its modifying function as a result of lithographic exposure, the necessary requirement of phase compatibility is imposed at this stage. Such compatibilty, again over a 500 Angstrom or better scale, may be confirmed as discussed under (A) above.

However, phase compatibilty of the initial blend prior to exposure is generally assurance of phase compatibility after lithographic exposure. As for depolymerizing polymer, chain reaction may proceed at ambient temperature under the influence of lithographic irradiaton alone. Alternatively, it may proceed by virtue of, or its rapidity increased, by other means such as heating during or subsequent to exposure. As in polymerization processes in general, inclusion of polymerization promoters in amounts generally contemplated for such polymerization are usefully included in the resist blend.

Exemplary monomers which may be caused to undergo polymerization upon exposure are trioxane and vinyl carbazole. Such monomers polymerize to produce polyformaldehyde and poly(vinyl carbazole). Resulting polymers are resistant to dissolution in aqueous alkaline media and so suggest utilization with matrix polymers which are soluble. Resist blends of this nature are negative acting.

C. Matrix polymer is selected on the basis of desired masking properites, of course consistent with usual resist requirements. The matrix polymer in general constitutes the major component of the resist (60 to 95 wt. %), and accordingly, such properties as film forming, adhesion, stability, etc., are in general determined by this component. It is particularly useful to the worker familiar with current fabrication techniques that resist patterns may be formed of material of behavior identically or similar to that of current materials. For this reason, novalacs so familiar in replication photoresists are exemplary of preferred embodiments both for positive acting and negative acting resists of the invention.

Novalacs are conveniently defined as condensation polymers or phenols (substituted or unsubstituted) with aldehyde-e.g., phenol formaldehydes. An additional category of resist materials familiar to the present day worker are the acidic acrylic-containing polymers, e.g., the copolymer of styrene, ethylacrylate, and methacrylic acid. Both categories, in current use in photoresists, are suitably incorporated in blends of the invention in which they may serve as matrix polymer.

As elsewhere in this description, parameters such as molecular weight, molecular weight distribution, degree of branching, etc., vary in accordance with the particular composition chosen and are well understood by the artisan. Such parameters in general are significant in defining that class of material having suitable viscosity, film forming properties, stability, sensitivity (where applicable) etc. For the novalacs, it is convenient to operate within a weight average molecular weight range generally of from 300 to 3,000. For the second category listed ease application and other practical considerations dictate a much higher range—of the order from 2,000 to 40,000.

Such matrix polymers are, combined with modifiers as, e.g., listed in section (B) above. Use of a depolymerizing modifier, e.g., a sulfone, results in initial insolubilizaton in, for example, aqueous sodium hydroxide with irradiation-promoted vapor development returning the matrix polymer essentially to its virgin solubility state where irradiated. Use of a polymerizing modifier results in insolubilization of the blend only where exposed to lithographic radiation, thereby producing a negative acting resist.

Other compositional variations are concerned with additives for a variety of known purposes. So, for example, cross-section for a specific X-ray wavelength may be increased by appropriate choice of composition of either soluble polymer or dissolution inhibitor (more generally of modifier). In addition, halogen-containing materials or other appropriate materials may be admixed physically or even copolymerized. Antioxidants, antiozonants and adhesion-promoting additives are among those contemplated.

III. PROCESSING

This section is set forth in general terms with ranges indicated where suitable. Best modes contemplated are set forth in specific terms under Examples.

A. Patterning

Contemplated processes include primary pattern delineation, whether in a mask or a maskless process, as well as pattern replication (secondary pattern delineation). This section outlines procedures which may be followed by delineation including: (1) application and other initial preparation; (2) exposure; (3) development; (4) subsequent resist processing.

(1) Application and Other Initial Preparation

The resist solution is prepared by dissolving the polymeric material in a suitable solvent. The solution is then coated on a substrate using, for example, conventional spin coating techniques. Exemplary solvents are cyclohexanone and mixture thereof. Factors dictating their choice include boiling point (90–150 degrees C.): lower boiling point increases the need for precautions to avoid loss during deposition; higher boiling point results in inconvenient evaporation rates during coating). Concentration, again, is determined by usual considerations, such as desired film thickness and viscosity requirements for contemplated coating conditions. In general a solute concentration of from 3 to 12 weight percent solute is useful for flood-spin coating.

While application may take many forms, the examples make use of conventional coating by flooding and subsequently spinning. (Choice within the range of from 1,000–10,000 rpm results in an adequate thickness range for the indicated solute-solvent concentration range.)

Following spinning, the air dried film may be prebaked to remove residual solvent. Typically, temperatures of from 40 degrees C. to 120 degrees C. for a period of a few hours is suitable.

Freedom of choice of matrix polymer without regard to radiation sensitivity permits designation of materials which may be treated subsequent to development. For example, novolacs may be crosslinked by heating in an oxygen-containing atmosphere, typically for a period of an hour at temperatures of 130 degrees C. or higher. The extent of crosslinking and, therefore, stability during processing under many circumstances is increased by increased time and/or temperature. Minor amounts of additive materials desinged to promote such crosslinking under a variety of influences, such as heating, may be included in the resist composition.

(2) Exposure

Generally total absorbed dose of 5 to 50 megarads is required. In electron beam lithography, this is equivalent to an incident dose of approximately 1 to 10 microcoulombs/cm$^2$ at 10 dv for usually contemplated film thickness. Accelerating voltage over the range of from 5–20 kilovolts results in compensating increasing electron density and decreasing absorption cross-section for usual electron sources so that throughput is not significantly affected.

Required absorbed dosage is independent of the form of actinic radiation used. Absorption cross-section, however, varies appreciably. For example, extinction ratios may be of the order of 10 percent absorption for x-ray exposure.

Dosage indicated is in terms of removal of irradiated material without any thinning or unirradiated material. Data in the literature is sometimes based on forced development in which unirradiated material is thinned during development. On this basis, dosage may be reduced from the indicated values.

(3) Post-Exposure Treatment

This step, sometimes required; sometimes designed to improve sensitivity involves introduction of additional energy to effect or better effect modification of matrix polymer development characteristics. Where the modifier is designed to depolymerize, this step may consist of heating to continue the depolymerization process (perhaps terminated at lower temperature by free radical trapping). The same procedure may bring about a continuation in the polymerization in the instance of a polymerizing modifier. Maximum permissible temperature is determined by the desire to avoid undesirable thermally induced reaction. In the instance of a positive acting novolac resist, useful temperatures are 90-100 degrees C. with heating continuing for up to about 30 minutes.

(4) Development

Wet development may be carried out under a variety of conditions—e.g., at room temperature in an aqueous or nonequeous alkaline solution in suitable solvent. Exemplary matrix materials of the novolac family, as well as acidic-acrylic-containing polymers, are developable in aqueous or nonaqueous alkaline solution—e.g., NaOH or an amine, respectively. A typical developing solution is aqueous NaOH with a pH of from 11 to 13.

(5) Subsequent Resist Processing

Post-baking is generally desirable to free the now developed resist of developing solvent. Under certain circumstances, as in plasma etching, where some heating implicitly results, a separate post-baking step may not be necessary. For resist layer thicknesses of up to about one micron solvent is substantially removed by baking for a period of up to about thirty minutes at temperatures of up to about 120 degrees C. Atmosphere is not generally critical.

B. Mask Making

It is contemplated that material/process pairs of the invention may be valuably incorporated in the fabrication of masks. Use of the invention is particularly appropriate for extremely fine feature masks where dry processing such as plasma etching is contemplated for the now underlying supported layer in which the pattern is to be replicated. For many purposes, typical structures at this stage in processing consist of a highly polished glass substrate supporting a thin layer of chromium or chromium oxide which, in turn, supports the now delineated resist pattern. In such procedures, need for heat extraction may be avoided or lessened by post-delineation curing as in direct processing. A chromium or chromium oxide layer of a thickness of 0.5 micrometers or less may be pattern delineated by exposure to a conventional plasma environment, e.g., a gaseous mixture of chlorine and oxygen with a chlorine content of between 30 and 70 volume percent, a pressure of 0.1-0.4 Torr, and a power input of 100-500 watts using a conventional tubular plasma reactor (13.5 megaHertz). These plasma conditions result in an etch rate of chromium or chromium oxide of between 10 and 40 nanometers/minute. Following replication, the resist pattern is usually stripped, for example, by sulfuric acid-potassium dichromate stripping solutions or oxygen plasma treatment.

Resist compositions of the invention may be used to mask underlying surfaces during conventional wet chemical etching. For example, the glass supported metal or metal oxide layer, in turn, supporting the delineated resist is dipped in or sprayed with—e.g., ceric ammonium nitrate/acid etching solution. Room temperature treatment for one minute is generally sufficient—in usual practice, etching is continued for thirty seconds beyond clearing.

As elsewhere in this description, conventional practice is largely in terms of exemplary procedures. As in other sections, alternatives are appropriate—e.g., potassium permanganate-based wet etches, as well as reactive ion etching or sputter etching may be utilized in "hard" mask fabrication.

C. Device Fabrication

This section is largely in terms of fabrication of large scale integrated circuits, LSIs. At this time most significant contemplated use concerns fabrication in/on epitaxial silicon layers supported by silicon substrates. There is also interest in other semiconductors as well as in magnetic devices such as bubble devices. Fabrication of typical bubble devices involves patterning of magnetic garnet epitaxial layers and permalloy. Integrated optic circuits represent another example of fine line devices which may be fabricated by use of the invention. Materials to be patterned may include $SiO_2$, $LiNbO_3$, $LiTaO_3$, etc.

The inventive teaching is of particular significance in the fabrication of fine features by dry processing. However, commercial practice which favors minimum inventory and efficient use of apparatus may result in use in less demanding processing steps as well.

A brief fabrication outline of a silicon integrated circuit is set forth for illustrative purposes. The procedure contemplates use of a silicon wafer bearing an epitaxial layer of device grade silicon of appropriate conductivity type, resistivity, thickness, etc. The listing is generally in a form appropriate for MOS fabrication. A variety of alternatives which may concern bipolar, as well as MOS devices, are contemplated. Each of the enumerated steps assumes prior deposition, delineation, and processing to result in a completed resist pattern. The outline is in tabular form with each step where suitable in terms of two alternative entries—the first directed to wet processing and the second to dry. Also unstated, but common to each level with the possible exception of the terminal step, (unless otherwise noted) is stripping of the resist pattern after processing.

Dry processing contemplates modification of bared regions of substrate by a vapor agent. For these purposes, dry processing contemplates all nonliquid/nonsolid media whether uncharged or charged; whether of balanced or unbalanced charge. The term "plasma" is used without regard to special meanings sometimes assigned by specialists in different disciplines—e.g., it does not necessarily connote a medium within a volume in which charges are balanced on a macroscale. At this time, a variety of dry processing steps are in use. Descriptive terms sometimes overlapping but all contemplated where the term dry processing is used include: ion etching, ion beam milling, reactive ion etching, plasma etching, reactive sputter etching, sputter etching, and gas phase chemical etching.

Dry processes may also be designed to modify underlying substrates through material introduction or other mechanism, as well as removal. Such dry processing may involve true material addition as an implantation, vacuum deposition, sputter deposition, as well as deposition through reduction or oxidation reactions; or other change, such as, local strain enhancement, e.g., as resulting from lattice distortion due to high energy bombardment. The enumeration is not intended to be exhaustive.

Inverse masking (lift-off) is conventionally used for delineating final metallization levels, e.g., on semiconductor devices, as well as photomask patterns. The process entails pattern delineation of the resist followed by flood deposition (overall deposition covering both masked and unmasked regions) of the desired film and subsequent stripping of the resist-film in a suitable solvent. To the skilled artisan, it is meaningful to consider such a combined process as "dry processing" for the reason that flood deposition—ordinarily by use of a vapor species—is resolution controlling.

All such designated species, as well as others that may evolve, are desirably incorporated in circuit fabrication, generally, to more easily realize fine resolution and line width control.

While an advantage of the inventive resists is their comparative stability to dry processing media, they have been found suitable for wet processing procedures, as well. It is not generally alleged that these resists are necessarily superior to known resists in use at this time. It is possible that their use in wet processing may be a matter of convenience. In general, in commercial processing economy in use of apparatus as well as in inventory control is realized by minimizing the number of agents used. Wet etching contemplated, therefore, includes the whole spectrum of procedures in use or to be used. A listing of contemplated wet processes includes: liquid etching, electrode, electroless, or displacement plating.

SILICON LSI FABRICATION PROCEDURES

(1) Etching of CVD Silicon Nitride DRY

Reactor: Parallel plate (Conditions noted are for a 15" diameter reactor)
Gas mixture: 80–75 vol. % tetrafluoromethane (TFM)-remainder oxygen
Power: 75–450 watts
Pressure: 0.1–0.5 Torr
Flow Rate: 60–250 cubic centimeters/minute
Etch Rate: 100–300 nanometers/minute

(2) Etching of Pyrolytic Silicon Nitride

DRY

Reactor: Parallel plate (conditions noted are for a 15" diameter reactor)
Gas Mixture: 40–65 vol. % perfluoroethane remainder trifluoromethane
Power: 750–1250 watts
Pressure: 0.5–0.9 Torr
Flow rate: 60–120 cu. cm/min.
Etch rate: 15–35 nanometers/min.

(3) Etching of Phosphorous Doped Glass

WET

The liquid etch is a solution of 15 parts by volume hydrofluoric acid; 10 parts by volume nitric acid; and 300 parts by volume water. The etch rate from this mixture is approximately 12–15 micrometers/min.

DRY

Dry etching conditions are identical to that of pyrolytic silicon nitride with a resulting etch rate of 100–200 micrometers/min.

(4) Etching of Polysilicon

WET

The liquid etchant is a mixture of 3 parts by volume hydrofluoric acid and 5 parts by volume nitric acid. The etch rate, typically 20 nanometers/min., is dependent on the type of amorphous silicon being etched.

DRY: Isotropic Dry Etching

Reactor: 15" diameter parallel plate.
Gas Mixture: 85–95 vol.% carbon tetrafluoride, remainder oxygen.
Power: 100–300 watts
Pressure: 0.2–0.4 Torr
Flow rate: 90–160 cu. cm/min.
Etch rate: 100–200 nanometers/min.

DRY: Anisotropic Dry Etching

Reactor: 15" diameter parallel plate
Gas Mixture: 70–90 vol. % perfluoroethane remainder trifluorochloromethane
Power: 300–800 watts
Pressure: 0.2–0.5 cu. cm/min.
Flow rate: 60–150 cu. cm/min.
Etch rate: 80–130 nanometers/min.

(5) Etching of Aluminum and Aluminum Alloys

WET

The wet etchant is a mixture of 85 parts by volume phosphoric acid; 5 parts acetic acid; 5 parts nitric acid; and 5 parts water. The etch rate is approximately 1 micrometer/min.

DRY

Reactor: 15" diameter parallel plate
Gas Mixture: 79–95 Vol. % carbon tetrachloride, remainder helium.
Power: 1,000–2,000 watts
Pressure: 0.2–0.5 Torr
Flow rate: 900–1500 cm$^3$/min for $CCl_4$ with He flow rate is adjusted to result in the desired total pressure.
Etch rate: 800–1500 nanometers/min. Currently this is the most rigorous of all plasma etching conditions with the resist frequently being subjected to temperatures in excess of 250 degrees C.

(6) Etching of Silicon Dioxide (thermal and CVD)

WET

The liquid etchant is a standard buffered aqueous solution containing 34.6 weight percent ammonium fluoride and 6.8 weight percent hydrofluoric acid. The etch rate of this mixture is 100 nanometers/minute.

DRY

Dry etching is done using the same conditions as phosphorous doped glass resulting in an etch rate of 60–100 nanometers/min.

III. EXAMPLES

EXAMPLE 1

(A) Preparation of Matrix Polymer—A Novolac

A 1,000 ml three-neck round bottom flask equipped with a variable speed mechanical stirrer, a water cooled condenser and a thermometer is charged with the following ingredients: 34.0 grams m-cresol; 136.0 grams o-cresol; 30.0 grams p-t butyl phenol; and 126.2 grams of 37 percent aqueous formaldehyde solution. 1.0 gram of oxalic acid is added as a catalyst and the temperature of the mixture is increased to reflux with continuous stirring. After 10 hours, 0.5 grams of additional catalyst is added and thereafter the reaction is allowed to continue for a further period of ten hours. At this time, the reaction is stopped by removal of the heating means, and the mixture is washed with distilled water. After the aqueous layer is removed by decantation a condenser is connected to an adapter to permit distillation of the volatile components. A vacuum pump is attached to the reaction vessel, and the novolac is heated slowly under vacuum to minimize foaming. Once the novolac is melted, the stirrer is started and heating is continued until the temperature of the novolac reaches 220 degrees C. It is held at 220 degrees C. until the pressure drops to 0.1 mm of mercury, thereby insuring virtually complete removal of the monomers. The vacuum is then released under nitrogen in order to prevent oxidation of the novolac. The molten polymer is then poured into aluminum trays to cool.

(B) Preparation of Modifier—A polysulfone

A sample of 2-methyl-1-pentene is refluxed at 61 degrees C. in a 1,000 ml round bottom flask equipped with a water cooled condenser and a thermometer over LiAlH$_4$ for approximately one hour to remove peroxides. The flask is then equipped with a fractional distillation column, condenser and take off adapter. Sixty milliliters of the so treated monomer is distilled and the condensate is introduced into a 500 ml round bottom flask provided with a septum inlet. The flask is attached to a vacuum line and the contents degassed through four successive freeze-thaw cycles (in which the contents are first frozen, degassed, and melted). The reaction vessel is cooled to −80 degrees C. A sulfur dioxide cylinder is connected to the vacuum line and 300 ml of sulfur dioxide is condensed into the reaction vessel at −80 degrees C. The flask is then sealed under vacuum and removed from the vacuum line. The flask and contents are allowed to warm to −70 degrees C. The contents and the flask thoroughly mixed, are placed in a bath at that tempeature. 5 ml of a 2 percent solution of t-butyl hydroperoxide in toluene is added by means of a syringe through the septum. After five minutes, the flask is removed from the bath, broken open, the contents transferred into 2,000 ml of acetone and stirred to insure homogeneous solution. The polymer is then precipitated into methanol, redissolved in 2,000 ml of acetone and reprecipitated. It is finally dried for 48 hours under vacuum at ambient temperature.

(C) The Resist Solution Preparation

Resist solutions are prepared by dissolving 20 grams of the novolac with 2 grams of poly(2-methyl-1-pentene sulfone) in a solution comprised of 50 percent of volume of methoxy ethyl acetate and 50 percent by volume cyclohexanone. The solutions are then filtered several times through a 0.2 micron teflon filter. A silicon wafer with 0.5 micrometers of aluminum film is spin coated at 2,000 rpm with the resist solution. The resulting resist thickness is 1.0 micrometer. The resist coated substrate is prebaked at 120 degrees C. for two hours and exposed with a scanning electron beam to an incident dose of 5 microcoulombs/cm$^2$ at 20 kV. Following exposure. the exposed resist coated substrate is baked at 120 degrees C. for fifteen minutes. The development of the exposed film is effected by dipping into a basic aqueous solution of pH 12.6 for three minutes. The patterned resist substrate is then baked at 120 degrees C. for one hour. The bared aluminum is etched in a plasma assisted dry etching procedure as previously described under (5) Etching of Aluminum and Aluminum Alloys (DRY). The plasma assisted etching results in removal of approximately 1,000 Angstroms of resist. The resulting resolution is better than 1 micrometer.

EXAMPLE 2

The procedure of Example 1 is repeated with the exception that an oxidized silicon substrate with a thickness of 0.5 micrometers is used. Etching of the silicon dioxide is effected with a plasma assisted etching technique as described in (6) Etching of Silicon Dioxide (DRY). The resolution in this system is found to be at least 0.5 micrometers.

EXAMPLE 3

The procedure of Example 2 is repeated with the exception that a liquid etching technique described in (6) Etching of Silicon Dioxide (WET).

EXAMPLE 4

The procedure of Example 1 is repeated with the exception that a 1.0 micrometer polysilicon film is deposited on the silicon wafer prior to resist application. Etching of the polysilicon film is effected with a plasma assisted etching technique as described in (4) Etching of Polysilicon (DRY).

EXAMPLE 5

(A) Preparation of Matrix Polymer-Acidic Acrylic-Containing Polymer

A 1,000 ml reaction kettle is equipped with a stirrer, condenser, and port for introducing reactants. This reaction vessel is charged with 100 ml styrene, 70 ml ethyl acrylate, 25 ml methylacrylic acid, and 400 ml benzene. The reaction mixture is heated to reflux, and 1.2 grams benzoyl peroxide is added, along with 4 ml of bromomethane (as a chain transfer agent). The polymerication is carried out for three hours and the polymer, residual benzene and other components precipitated dropwise into 2 gallon methanol.

The polymer is filtered and washed with additional methanl and is dried in vacuum for 48 hours. The resulting polymer has a weight average molecular weight of approximately 10,000 and a molecular weight distribution of 3. The polymer contains 10 percent methylacrylic acid and is soluble in a sodium hydroxide solution, pH 12.6.

For comparison purposes a resist blend is prepared using the same amount of the same modifier as prepared in (B), (C) of Example 1.

Procedures of Example 2 through 4, are carried out with equivalent results.

We claim:

1. Process for fabrication of an article comprising an operation during which the article undergoing fabrication comprises an article surface and an overlying actinic processing layer, said processing layer comprising a phase compatible blend including polymeric material, said process including the steps of (1) selectively exposing portions of the said processing layer to patterning actinic radiation whereby a difference in ease of removal of exposed portions relative to unexposed portions of the said processing layer by a developing agent is effected; (2) developing by treating the said processing layer with said developing agent to selectively remove material, thereby producing a patterned processing layer said pattern being defined by regions of the said processing layer within which material is selectively removed; (3) treating the article undergoing fabrication with an altering agent which preferentially alters regions of the said article surface corresponding with said regions of the patterned processing layer, relative to regions of the said article surface corresponding with the remainder of the said patterned processing layer, CHARACTERIZED IN THAT the said phase compatible blend comprises a "matrix polymer" determinative of the characteristics of the said remaining regions of the patterned processing layer together with a modifier which is the part of the blend primarily responsive to actinic radiation which responds to radiation primarily via a self-propagating reaction initiated by the said radiation to effect the said relative ease of removal, in which the blend is positive acting so that self-propagating reaction initiated by the said radiation increases relative ease of removal and in which the modifier is a polymer which is less soluble in the said developing agent than is the matrix polymer so that the blend, in turn, is less soluble in the developing agent wherein actinic radiation results in depolymerization to permit selective removal of modifier in irradiated portions of the said processing layer.

2. Process of claim 1 in which the modifier is at least, in part, vapor developable so that radiation-induced depolymerized modifier volatilizes during exposure.

3. Process of claim 2 in which the matrix polymer is soluble in alkaline media with developing comprising wetting of the processing layer to result in selective dissolution of exposed portions.

4. Process of claim 3 in which developing is carried out in aqueous media.

5. Process of claim 2 in which the radiation-induced change in the modifier is enhanced by heating.

6. Process of claim 5 in which heating is at least, in part, subsequent to selectively exposing.

7. Process of any of claims 1, 2, 3, or 4 in which the said altering agent alters the said article surface by removal of material.

8. Process of claim 7 in which the said altering agent is liquid.

9. Process of claim 7 in which the said altering agent is nonliquid.

10. Process of claim 1, 8, or 9 in which step (3) is a dry processing step.

11. Process of claim 10 in which the dry processing may be characterized as a procedure selected from the group consisting of ion etching, ion beam milling, reactive ion etching, plasma etching, reactive sputter etching, sputter etching, gas phase chemical etching, ion implantation, vacuum deposition, sputter deposition, and chemical vapor deposition.

12. Process of claim 11 in which step (3) consists of material removal from the said article surface and in which the dry processing may be characterized as a procedure selected from the group consisting of ion etching, ion beam milling, reactive ion etching, plasma etching, plasma assisted etching, reactive sputter etching, sputter etching, gas phase chemical etching.

13. Process of claim 12 in which the said article includes a silicon circuit element.

14. Process of claim 13 in which the said article is a silicon integrated circuit in which the said article surface undergoing fabrication contains an oxide of silicon and in which step (3) consists of plasma assisted etching.

15. Process of claim 14 in which said altering agent is produced from a gas containing chemically combined or physically admixed fluorine.

16. Process of claim 15 in which the said article is a magnetic circuit.

17. Process of claim 16 in which the said article is a bubble device and in which the said article surface is a magnetic material.

18. Process of claim 17 in which the said magnetic material comprises an alloy of nickel and iron.

19. Process of claim 18 in which the said alloy is permalloy.

20. Process of claim 12 in which the said article is an integrated optic circuit.

21. Process of claim 1, 2, 3 or 4 in which the matrix polymer is at least one member selected from the group consisting of novolacs and acidic acrylic polymers.

22. Process of claim 21 in which the said modifier includes at least one polysulfone.

23. Process of claim 22 in which the said polysulfone is poly(2-methyl-1-pentene sulfone).

24. Process of claim 23 in which the patterned processing layer is heated subsequent to developing in order to produce crosslinking.

25. Process of claim 1, 2, 3, or 4 in which the said actinic radiation consists of accelerated electrons.

26. Process of claim 25 in which the said accelerated electrons are focused to form at least one beam which is modulated and scanned relative to the said article undergoing fabrication to define the said pattern.

27. Process of claim 1, 2, 3, or 4 in which selectivity of exposure in step (1) results from nonselective radiation exposure of an apertured mask.

28. Process of claim 1 in which the said article is a discrete mask.

29. Process of claim 28 in which the said article surface consists essentially of a material selected from the group consisting of chromium and oxidized chromium.

* * * * *